United States Patent [19]

Kim

[11] Patent Number: 5,028,879
[45] Date of Patent: Jul. 2, 1991

[54] COMPENSATION OF THE GATE LOADING LOSS FOR TRAVELLING WAVE POWER AMPLIFIERS

[75] Inventor: Bumman Kim, Richardson, Tex.

[73] Assignee: Texas Instruments Incorporated, Dallas, Tex.

[21] Appl. No.: 581,447

[22] Filed: Sep. 10, 1990

Related U.S. Application Data

[63] Continuation of Ser. No. 613,678, May 24, 1984, abandoned.

[51] Int. Cl.$^5$ ............................................. H03F 3/60
[52] U.S. Cl. ..................................... 330/54; 330/277; 330/286
[58] Field of Search ......................... 330/54, 277, 286

[56] References Cited

U.S. PATENT DOCUMENTS 4,291,286  9/1981  Wagner ........................... 333/166
4,543,535  9/1985  Ayasli ............................. 330/277

FOREIGN PATENT DOCUMENTS 1205087  9/1970  United Kingdom ............... 330/54

*Primary Examiner*—James B. Mullins
*Attorney, Agent, or Firm*—Melvin Sharp; James T. Comfort; N. Rhys Merrett

[57] ABSTRACT

The disclosure relates to a circuit to reduce the gate loss in a semiconductor travelling wave power amplifier using series capacitors on the gate feeding lines for a distributed amplifier design. The circuit arrangement significantly increases the gate width of the amplifier with a resultant increases of the broadband output power and efficiency.

28 Claims, 1 Drawing Sheet

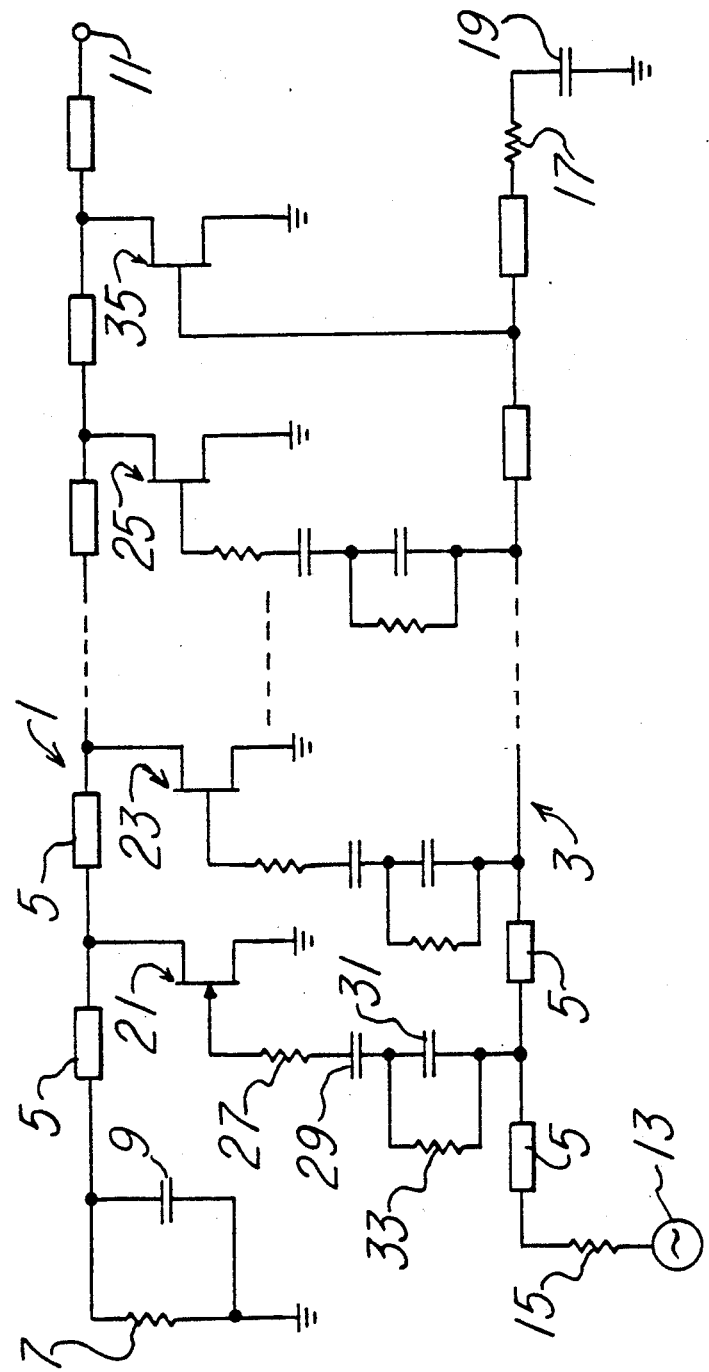

COMPENSATION OF THE GATE LOADING LOSS FOR TRAVELLING WAVE POWER AMPLIFIERS

This application is a continuation of application Ser. No. 06/613,678, filed May 24, 1984, now abandoned.

BACKGROUND OF THE INVENTION

1. Field of the Invention

This invention relates to a semiconductor travelling wave amplifier and, more specifically, to a circuit for reducing gate loss in such circuits.

2. Description of the Prior Art

GaAs FET device technology and monolithic circuit implementation techniques have been combined successfully for the development of ultrabroadband distributed amplifiers. However, the output power of such amplifiers has been limited to less than 200 mW, even with a common drain line power combining techniques. Due to transmission line losses and gate line losses in particular, the total gate width of the amplifier cannot be increased without limit. This is due to the fact that per stage losses will ultimately equal or exceed the gain obtained by addition of further amplifier stages.

For a GaAs FET distributed amplifier, it can be shown that the gate and drain attenuation coefficients, $\alpha_g$ and $\alpha_d$, are given by $$\alpha_g \approx (\omega C_g)^2 \cdot R_g Z_g / 2 \quad (1)$$

$$\alpha_d \approx Z_d / 2 R_d \quad (2)$$

In equations (1) and (2), $Z_g$ and $Z_d$ are the characteristic impedances of the gate and drain transmission lines. $C_g$ is the input (gate line) capacitance of an FET. $R_g$ and $R_d$ are input (gate line) and output resistances, respectively, of the FET. Due to the input and output resistances, significant losses are incurred as a result of dissipative loading. The attenuation of the gate line is particularly severe, due to the frequency dependent squared term. It is this attenuation that limits the maximum number of devices that can be implemented.

SUMMARY OF THE INVENTION

To reduce the gate line attenuation, in accordance with the present invention, a series capacitor is inserted between the FET gate of each stage and the transmission line. The inserted capacitor is in series with the effective gate line capacitance $C_g$ and thereby has a voltage drop thereacross in addition to the voltage drop across the gate line capacitance $C_g$ and the gate line resistance $R_g$. This causes the voltage drop across the gate line resistance $R_g$ to be decreased, thereby decreasing the power dissipation therein, resulting in a decreased $\alpha_g$ and increase of the maximum number of devices that can be implemented. This inserted capacitor and the FET input capacitance form a voltage divider, allowing for an increased signal level along the gate line. This results in a significantly higher output power and efficiency for a distributed amplifier.

To provide for a constant rf voltage across all the FET gates, the capacitance of the series inserted capacitors is tapered. A fairly constant gate voltage is maintained with the above described arrangement, even though the input signal at the gate line attenuates significantly.

BRIEF DESCRIPTION OF THE DRAWING

The FIGURE is a circuit diagram of a travelling wave power amplifier in accordance with the present invention.

DESCRIPTION OF THE PREFERRED EMBODIMENT

Referring now to the FIGURE, there is shown a travelling wave power amplifier in accordance with the present invention. The circuit includes a transmission line pair 1 and 3 which are shown as a plurality of inductances 5, it being well known that these inductances are actually representative of distributed impedance which is normal of transmission lines. The transmission line 1 includes a termination circuit comprising a resistor 7 and a capacitor 9 coupled to ground. The other end of the transmission line 1 terminates at a 50 ohm output 11. The signal input circuit is power source 13 and the source internal resistance 15, the transmission line 3 being provided with a termination which is comprised of the resistor 17 and capacitor 19 connected in series to ground. The transmission lines 1 and 3 are coupled together by means of GaAs FET devices, there being a plurality of such devices extending along the lines and being labeled, 21, 23 and 25, it being understood that more such stages would be provided between the stages 23 and 25 which are shown by the dotted lines.

As stated hereinabove, the normal gate line for each FET device inherently displays resistance and capacitance, such resistance being shown by the resistor 27 and the capacitor 29. The voltage drop across the gate line would normally be composed of the voltage drop across the capacitor 29 and the dissipative voltage drop across the resistor 27. It is the dissipative voltage drop across resistor 27 which causes the attenuation discussed hereinabove and limits the total number of stages of amplification which can be provided and thereby limits the power output of the amplifier.

In accordance with the present invention, a capacitor 31 with a DC bias resistor 33 thereacross is placed in series with the capacitor 29. The capacitor 31 retains some of the voltage drop in the gate line, thereby decreasing the voltage drop across the resistor 27 and the capacitor 29. This decrease in voltage drop across the resistor 27 decreases the amount of power dissipation in the circuit and permits the additional elements of the amplifier to be added to provide increased gain elements of the amplifier to be added to provide increased gain relative to the prior art. In order to provide constant rf voltages across the gates of FETs, which maximize the output power, it has been found that the added capacitor 31 should be tapered in value as one travels from the transmission line input toward the output.

The circuit in accordance with the present invention provides desired increase in gates width of a travelling wave amplifier with a resulted increase in the broadband output power and efficiency.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A travelling wave power amplifier which comprises:

(a) a transmission line pair having an input terminal and an output terminal;
(b) a plurality of gallium arsenide transistors, each transistor having a drain coupled to one of said lines of said transmission line pair, a gate coupled to the other line of said pair and a source coupled to a source of reference voltage;
(c) a capacitor external to each said transistor coupled between the other of said lines and the gate of each transistor; and
(d) a DC bias resistor external to each said transistor coupled between the other of said lines and the gate of each said transistor;
(e) said transistors being spaced along said transmission line pair.

2. A travelling wave power amplifier as set forth in claim 1 wherein capacitors are of increasing capacitance in the direction from the input to the output of said transmission line pair.

3. A travelling wave power amplifier as set forth in claim 2 wherein the capacitance values of said capacitors are set to provide substantially the same rf voltage across the gate of each transistor.

4. A travelling wave power amplifier as set forth in claim 3 wherein said transistors are FET transistors.

5. A travelling wave power amplifier as set forth in claim 2 wherein said transistors are FET transistors.

6. A travelling wave power amplifier as set forth in claim 1 wherein said capacitors are of varying capacitance value.

7. A travelling wave power amplifier as set forth in claim 6 wherein the capacitance values of said capacitors are set to provide substantially the same rf voltage across the gate of each transistor.

8. A travelling wave power amplifier as set forth in claim 7 wherein said transistors are FET transistors.

9. A travelling wave power amplifier as set forth in claim 6 wherein said transistors are FET transistors.

10. A travelling wave power amplifier as set forth in claim 1 wherein the capacitance values of said capacitors are set to provide substantially the same rf voltage across the gate of each transistor.

11. A travelling wave power amplifier as set forth in claim 10 wherein said transistors are FET transistors.

12. A travelling wave power amplifier as set forth in claim 1 wherein said transistors are FET transistors.

13. A distributed amplifier having an input terminal and an output terminal comprising:
a plurality of successively coupled transistors, each one thereof having an input electrode and an output electrode;
first means including a plurality of capacitors, which are the only capacitors coupled to said input electrodes, for capacitively coupling each one of the input electrodes of the plurality of transistors only to the input terminal; and
second means for cascade interconnecting the output electrode of each transistor having a first end coupled to the output terminal.

14. The distributed amplifier as recited in claim 13 wherein the coupling means further includes a transmission line and wherein each capacitor is coupled between said transmission line and the corresponding one of the input electrodes of the transistors.

15. A distributed amplifier having an input terminal and an output terminal comprising:

a plurality of successively coupled transistors, each one thereof having an input electrode and an output electrode;
first means including a plurality of capacitors for capacitively coupling each one of the input electrodes of the plurality of transistors only to the input terminal;
second means for cascade interconnecting the output electrodes of each transistor having a first end coupled to the output terminal;
wherein each transistor further comprises:
a reference electrode; and
a reactive component between the input electrode and the reference electrode;
wherein an input radio frequency signal is fed to the input terminal; and
wherein the value of capacitance for each one of said plurality of capacitors is selected in accordance with the value of the reactive component of each transistor to provide a predetermined portion of the input radio frequency signal to said transistors.

16. The distributed amplifier as recited in claim 15 wherein the value of capacitance for each of said capacitors is selected to provide substantially uniform predetermined portions of the input radio frequency signal.

17. A distributed amplifier having an input terminal and an output terminal comprising:
a plurality of successively coupled transistors, each one thereof having an input electrode and an output electrode;
first means including a plurality of capacitors for capacitively coupled each one of the input electrodes of the plurality of transistors only to the input terminal;
second means for cascade interconnecting the output electrode of each transistor having a first end coupled to the output terminal;
wherein the transistors further comprises:
a reference electrode; and
a reactive component between the input electrode and the reference electrode of each transistor;
wherein the first means has an impedance in accordance with the impedance of the reactive element between each input electrode and the grounded electrode and the reactance of the corresponding capacitor to provide the amplifier with a predetermined input impedance.

18. A distributed amplifier having an input terminal and an output terminal comprising:
a first plurality of successively coupled transistors, each one thereof having an input electrode and an output electrode;
first means including a plurality of capacitors, which are the only capacitors coupled to said input electrode, for capacitively coupling each one of the input electrodes of the plurality of transistors only to the input terminal,
a second plurality of successively coupled transistors, each one thereof having an input electrode and an output electrode;
second means, including a second plurality of capacitors, which are the only capacitors coupled to said input electrode, for capacitively coupling each of said input electrodes of the second plurality of transistors to the input terminal; and
a common means for electrically interconnecting the output electrode of each one of said transistors to the output terminal.

19. A distributed amplifier having an input terminal and an output terminal comprising:
- a first plurality of successively coupled transistors, each one thereof having an input electrode and an output electrode;
- first means including a plurality of capacitors for capacitively coupling each one of the input electrodes of the plurality of transistors only to the input terminal,
- a second plurality of successively coupled transistors, each one thereof having an input electrode and an output electrode;
- second means, including a second plurality of capacitors, for capacitively coupled each of said input electrodes of the second plurality of transistors to the input terminal; and
- a common means for electrically interconnecting the output electrode of each one of said transistors to the output terminal;
- wherein the output electrode of each one of the first plurality of transistors is coupled at a corresponding one of a plurality of common junctions of said common means with the output electrode of each one of the second plurality of transistors.

20. A distributed amplifier having an input terminal and an output terminal comprising:
- a first plurality of successively coupled transistors, each one thereof having an input electrode and an output electrode;
- first means including a plurality of capacitors for capacitively coupling each one of the input electrodes of the plurality of transistors only to the input terminal,
- a second plurality of successively coupled transistors, each one thereof having an input electrode and an output electrode;
- second means, including a second plurality of capacitors, for capacitively coupling each of said input electrodes of the second plurality of transistors to the input terminal; and
- a common means for electrically interconnecting the output electrode of each one of said transistors to the output terminal;
- wherein the first and second coupling means each further comprise a transmission line and wherein each capacitor is coupled between said transmission line and a corresponding one of input electrodes of the transistor.

21. A distributed amplifier having an input terminal and an output terminal comprising:
- a first plurality of successively coupled transistors, each one thereof having an input electrode and an output electrode;
- first means including a plurality of capacitors for capacitively coupling each one of the input electrodes of the plurality of transistors only to the input terminal,
- a second plurality of successively coupled transistors, each one thereof having an input electrode and an output electrode;
- second means, including a second plurality of capacitors, for capacitively coupling each of said input electrodes of the second plurality of transistors to the input terminal; and
- a common means for electrically interconnecting the output electrode of each one of said transistors to the output terminal;
- wherein each transistor includes:
  - a reference electrode;
  - a reactive component between the input electrode and the reference electrode;
- wherein an input radio frequency signal is fed to the input terminal; and
- wherein the value of capacitance for each one of said plurality of capacitors is selected in accordance with the value of the reactive component of each transistor to provide a predetermined portion of the input radio frequency signal to said transistors.

22. The distributed amplifier as recited in claim 21 wherein the value of capacitance for each of said capacitors is selected to provide substantially uniform predetermined portions of the input radio frequency signal.

23. A distributed amplifier having an input terminal and an output terminal comprising:
- a first plurality of successively coupled field effect transistors with cascaded gate electrodes, cascaded drain electrodes, a first one of such field effect transistors having the gate electrode thereof coupled to the input terminal, such terminal being adapted to receive an input radio frequency signal, and the last one of the successively coupled field effect transistors having the drain electrode thereof coupled to an output terminal, said output terminal being adapted to provide an amplified output radio frequency signal;
- first means, coupled to each one of the gate electrodes of the first plurality of field effect transistors, for providing separate bias and radio frequency signal paths;
- a second like plurality of successively coupled field effect transistors with cascaded gate electrodes, cascaded drain electrodes, a first one of such field effect transistors having the gate electrode thereof coupled to the input terminal and the last one of the successively coupled field effect transistors having the drain electrode thereof coupled to the output terminal;
- second means, coupled to each one of the gate electrodes of the second plurality of field effect transistors, for providing separate bias and radio frequency signal paths; and
- common means, for electrically interconnecting the drain electrode of each one of the field effect transistors to the output terminal of the distributed amplifier.

24. The distributed amplifier as recited in claim 23 wherein electrical pathlengths between the input terminal and the output terminal through each one of the field effect transistors are substantially equal.

25. The distributed amplifier as recited in claim 24 wherein the field effect transistors further comprise a reference electrode and a reactive component between the gate electrode and reference electrode of each field effect transistor; and
- wherein each one of the first and second means comprise a transmission line and a plurality of capacitors, with each capacitor being coupled between said transmission line and a corresponding one of said gate electrodes of the field effect transistors, and wherein said transmission line has an impedance in accordance with the impedance of the reactive element between each gate electrode and reference electrode and the impedance of the corresponding capacitor to provide the distributed amplifier with a predetermined input impedance.

26. The distributed amplifier as recited in claim 25 wherein each field effect transistor includes a reactive element between the drain electrode and the reference electrode and wherein the coupling means includes a common transmission line having a characteristic impedance in accordance with the impedance of the reactive element between drain and reference electrodes of each field effect transistor to provide the distributed amplifier with a predetermined output impedance.

27. The distributed amplifier as recited in claim 23 wherein the first and second means each include a transmission line, a plurality of capacitors, with each capacitor being coupled between said transmission line and a corresponding one of gate electrodes of the field effect transistor to provide the radio frequency path; and
 a like plurality of resistors, each one coupled between a common bias line and a corresponding one of said input electrodes.

28. The distributed amplifier as recited in claim 27 wherein each field effect transistor includes a reference electrode and a reactive component between the gate electrode and reference electrode; and
 wherein the value of capacitance for each one of said plurality of capacitors is selected in accordance with the value of the reactive component of each field effect transistor to provide predetermined radio frequency input signals to said field effect transistors.

* * * * *